(12) United States Patent
Kurd

(10) Patent No.: US 6,469,550 B1
(45) Date of Patent: Oct. 22, 2002

(54) PARALLEL PHASE LOCKED LOOPS SKEW MEASURE AND DYNAMIC SKEW AND JITTER ERROR COMPENSATION METHOD AND APPARATUS

(75) Inventor: Nasser A. Kurd, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,426

(22) Filed: Dec. 30, 1999

(51) Int. Cl.[7] .................................................. H03L 7/00
(52) U.S. Cl. ........................................ 327/141; 327/144
(58) Field of Search ................................. 327/141, 144, 327/149, 153, 158, 159, 161, 261, 269, 270; 331/11, DIG. 3

(56) References Cited

U.S. PATENT DOCUMENTS

| | | | | |
|---|---|---|---|---|
| 5,627,500 A | * | 5/1997 | Wolaver et al. | 327/231 |
| 5,631,591 A | * | 5/1997 | Bar-Niv | 327/12 |
| 5,675,273 A | * | 10/1997 | Masleid | 327/156 |
| 5,819,076 A | * | 10/1998 | Jeddeloh et al. | 711/100 |
| 5,990,719 A | * | 11/1999 | Dai et al. | 327/141 |

* cited by examiner

Primary Examiner—Timothy P. Callahan
Assistant Examiner—Linh Nguyen
(74) Attorney, Agent, or Firm—Blakely, Sokoloff, Taylor & Zafman LLP

(57) ABSTRACT

A method and apparatus for skew measure and dynamic skew and jitter error compensation. A plurality of programmable delay lines corresponding to a plurality of signals is provided, wherein each delay line is in a path of a corresponding signal. A skew measure circuit is configured to receive at least two signals to be synchronized. The skew measure circuit determines a phase difference between the at least two signals. The skew measure circuit is coupled to the programmable delay lines and uses the phase difference to program at least one of the delay lines to delay at least one of the signals to be synchronized such that the signals are in synchronization.

17 Claims, 9 Drawing Sheets

PARALLEL PHASE LOCKED LOOPS SKEW MEASURE AND DYNAMIC SKEW AND JITTER ERROR COMPENSATION METHOD AND APPARATUS

FIELD OF THE INVENTION

The present invention relates to synchronizing circuits that use phase locked loops (PLLs) and in particular, to dynamic skew compensation in PLLs.

BACKGROUND OF THE INVENTION

Synchronous circuits such as synchronous integrated circuits, generally require clock generators that synthesize desired frequencies and are in sync with a reference clock. In many instances, the clock generator may be a PLL circuit. However, between two or more circuits with two or more PLLs, the operational frequency of one circuit may be different from the other. Moreover, the frequency of one circuit may not be a multiple of the other. In this instance, a PLL is used to synthesize a frequency for use by a respective circuit. For example, each circuit uses a PLL to synthesize a frequency from a reference clock (XCLK). One PLL may synthesize a frequency of XCLK *N and another PLL may synthesize a frequency of XCLK *M, where N and M are real numbers.

In instances where signals need to interface between two or more PLL clock domains, the skew and jitter of each PLL utilized needs to be accounted for so there can be synchronous transmission of signals without errors. However, between PLL clock domains operating at high frequencies, skew and jitter make it difficult for such signals to be transmitted synchronously without synchronization mechanisms. However, to add a synchronization mechanism to every signal that crosses the boundary between two PLL clock domains is costly in terms of power, substrate area and signal latencies. Therefore, it is desired to allow a signal to cross between PLL clock domains with minimum signal latencies and to save power and substrate area, without requiring synchronization mechanisms.

SUMMARY

An apparatus and method are disclosed in which a plurality of programmable delay lines corresponding to a plurality of signals are provided such that each delay line is in a path of a corresponding signal. A skew measure circuit is configured to receive at least two signals to be synced and determine a phase difference between the at least two signals. The skew measure circuit is coupled to the plurality of delay lines, and the skew measure circuit is further configured to use the phase difference to program at least one of the delay lines to delay at least one of the signals to be synced such that the signals are in sync.

Additional features, embodiments, and benefits will be evident in view of the figures and detailed description presented herein.

DETAILED DESCRIPTION

Figure 1:
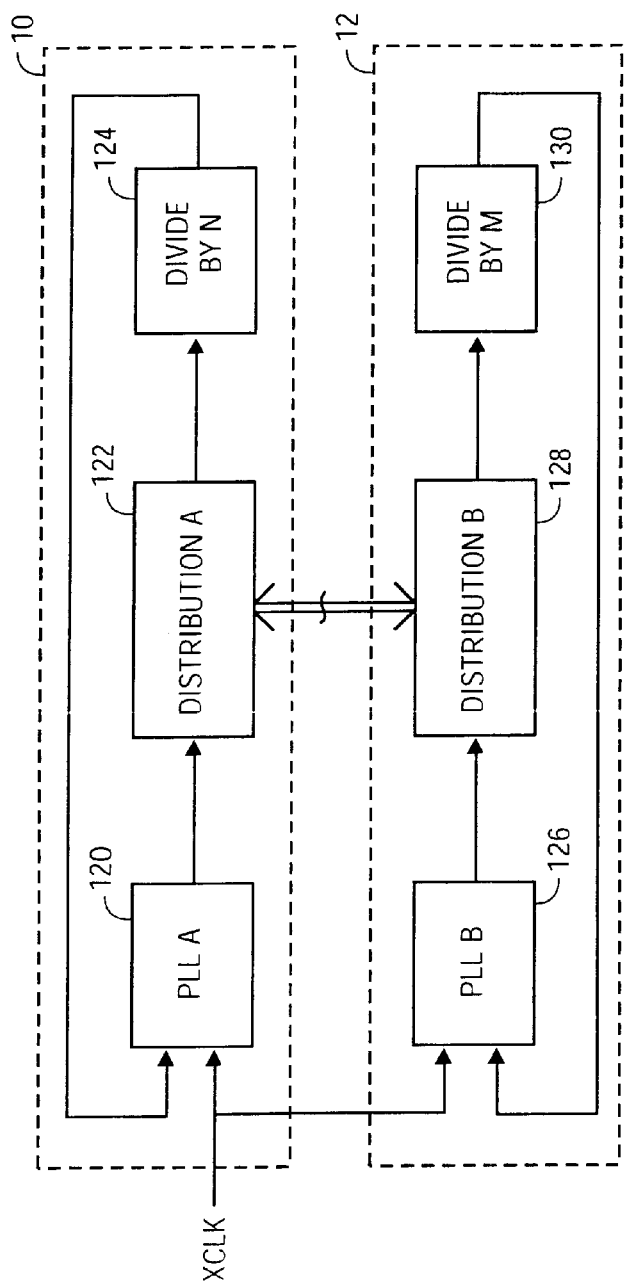
FIG. 1 is a schematic diagram of a plurality of circuits, each circuit being a phase locked loop circuit.

FIG. 1 is a schematic diagram of a plurality of circuits 10, 12, each circuit having a PLL in accordance with the prior art. According to the example, the PLLs are used to synthesize a desired operating frequency of the circuit embodying the PLL. As illustrated, each PLL is coupled to a common clock, such as a reference clock XCLK from which the desired operating frequency is synthesized. For example, one PLL may synthesize a frequency of XCLK * N and another PLL may synthesize a frequency of XCLK * M, where N and M are real numbers. The operation of the circuits is now described.

One circuit, PLL A 120 receives the reference clock XCLK. Using the PLL's phase detector, PLL A adjusts its local voltage controlled oscillator (VCO) to align with the reference clock XCLK and synthesizes an operating frequency XCLK*N. The aligned and synthesized clock is transmitted to distribution A 122, which distributes clock signals as needed for use by the circuit associated with the PLL. From distribution A 122, the clock signal is transmitted to divide by N frequency divider 124. The frequency divider 124 divides the clock signal by N, which is fed back to the PLL A 120 for use by its phase detector along with the reference source XCLK. In this manner, PLL A 120 synthesizes a clock signal, which is N multiples of the reference clock and which ideally should be in sync with the reference clock XCLK. In practice, however, the PLL A 120 and distribution A 122 introduce phase error(skew and jitter) to the synced clock. The skew, in particular, generally causes the synthesized clock XCLK * N to be leading or lagging the reference clock XCLK. In another circuit, similarly, PLL B 126 detects the incoming reference clock XCLK using its phase detector. PLL B 126 locks its VCO to the reference clock XCLK. The synced clock is transmitted to distribution B 128 from which the clock is transmitted to its corresponding circuit and to M frequency divider 130. The M frequency divider 130 divides the clock by M, which is fed back to PLL B 126 for use by its phase detector along with the reference source XCLK.. Likewise, due to the PLL B's VCO and other circuit elements, skew is introduced to the synced clock causing the synthesized clock XCLK * M to be leading or lagging the reference clock XCLK. The distribution circuits 122 and 128 may be implemented as an H tree. Likewise, the specifics of an implementation of the PLLs and frequency divider circuits are well known to persons skilled in the art.

Figure 2:
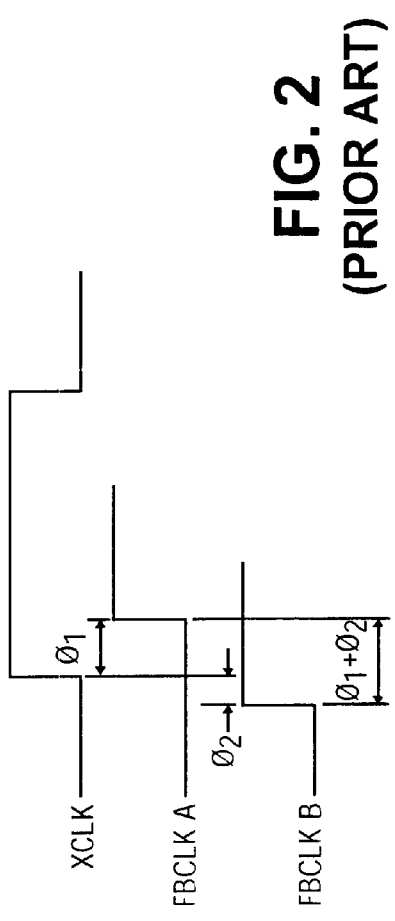
FIG. 2 is a timing diagram showing skewed jitter error introduced in the PLLs of the above Figure.

Note that in both circuits, the feedback loop of the PLLs, PLL A, PLL B have introduced skew and jitter to their respective clock domains. The skew between the two clock domains will be particularly severe where the PLLs, for example, PLL A and PLL B, have skews that are in the opposite direction. As shown in FIG. 2, for example, the synthesized clock generated by PLL A may lag the reference clock by ø1 and the clock generated by PLL B may lead the reference clock by ø2. In this instance, the skew between the two clock domains PLL A and PLL B will be ø1+ø2. In the event that signals need to cross the boundary between the two clock domains 10, 12, the skew may cause the transmitting circuit and the receiving circuit to be out of sync thereby causing erroneous signals to be received. This problem is compounded, as the operational frequency becomes higher.

Figure 3:
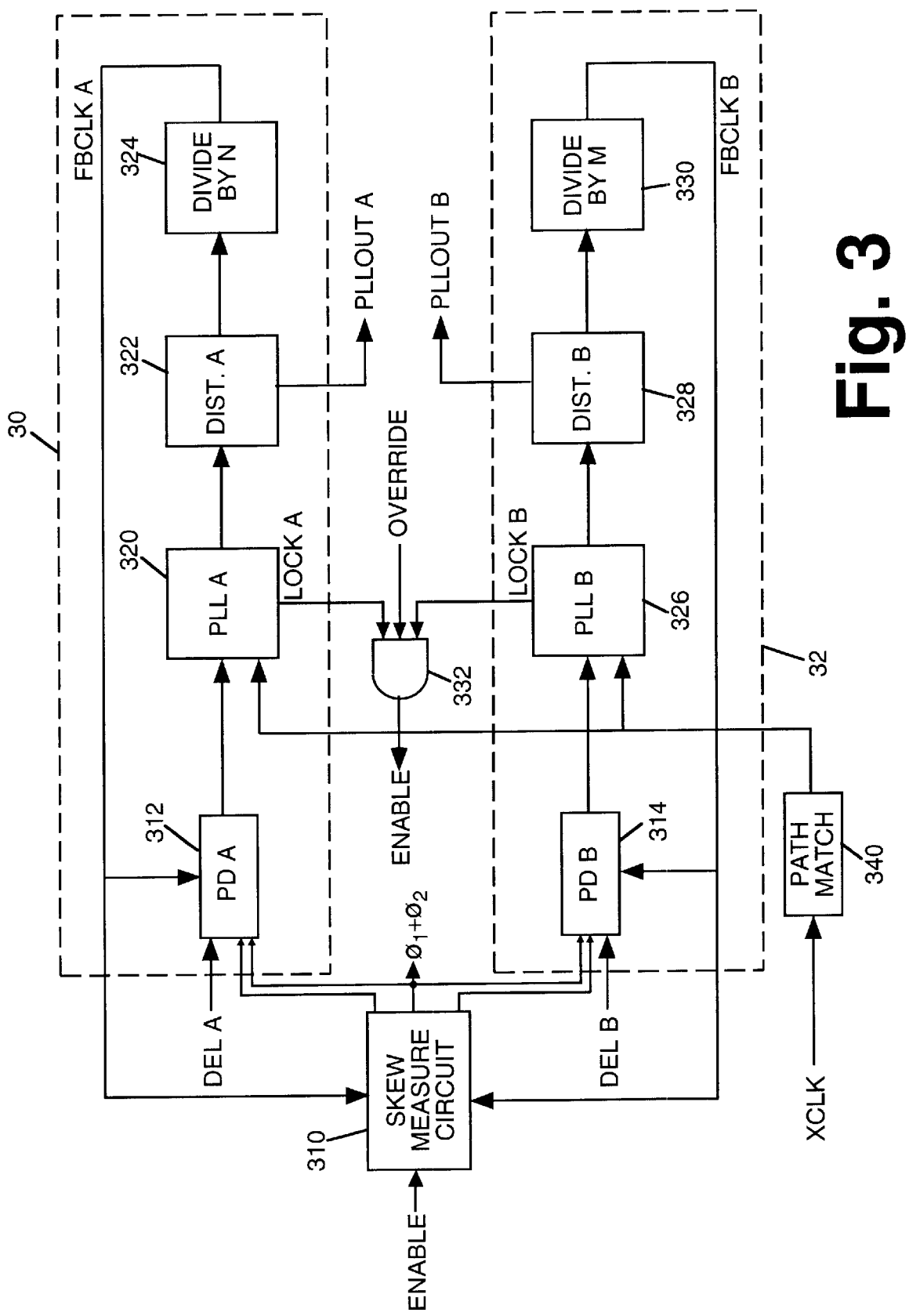
FIG. 3 is a schematic diagram of a plurality of PLL circuits in which a skew measure circuit and programmable delay devices have been implemented in accordance with one embodiment of the invention.

FIG. 3 is a schematic diagram of a plurality of circuits, each having a PLL in which a skew measure circuit 310 and programmable delay devices 312, 314 and path match circuit 340 have been implemented in accordance with an embodiment of the invention. In this figure, feedback clocks FBCLK A and FBCLK B are shown coupled to the skew measure circuit 310. The skew measure circuit 310 and the programmable delay devices 312, 314 allow the skew and jitter introduced by the PLLs, PLL A 320, PLL B 326 to be accounted for so that signals PLLOUT A and PLLOUT B can cross the boundary of the two circuits 30, 32, without becoming erroneous.

Turning now to the skew measure circuit 310, the circuit measures the skew between the two clock domains and quantifies the skew. As shown in FIG. 3, the clock outputted from frequency divider 324 of circuit 30 is input into the skew measure circuit 310 instead of being inputted directly into PLL A 320 as in the prior art. Similarly, the clock outputted from frequency divider 330 of circuit 32 is input into skew measure circuit 310 instead of being inputted into PLL B 326. The skew measure circuit 310 receives the two clocks and outputs the skew difference of the two circuits ø1+ø2. AND gate 332 operates so that when PLL A and PLL B are each in phase lock with XCLK, ENABLE is asserted and input to skew measure circuit 310. OVERRIDE may be used to ensure that ENABLE is not asserted in the event the skew difference determination is not needed in a particular application. Path match circuit 340 operates to compensate for the extra delay imparted by the programmable delay circuits 312 and 314.

In one embodiment, the skew measure circuit 310 outputs a signal that indicates which of the two circuits 30, 32 is leading or lagging the other. The lead/lag signal along with the skew difference ø1+ø2, are transmitted to the programmable delay devices 312, 314, which, in turn, dynamically increase or decrease delay in the feedback paths. The delay of the programmable delay devices 312, 314 compensate for the skew difference between the clock domains 30, 32 and allow them to be in sync. In one embodiment, the skew measure circuit signals may be overridden with external values such as delay adjust A (DEL A) and delay adjust B (DEL B), which adjust the delay of the programmable delay devices 312, 314 statically. This overriding may be used in situations where the skew difference between the two clock domains 30, 32 is relatively stable and may be predetermined or used for intentionally introducing skew for debug purposes.

Figure 4:
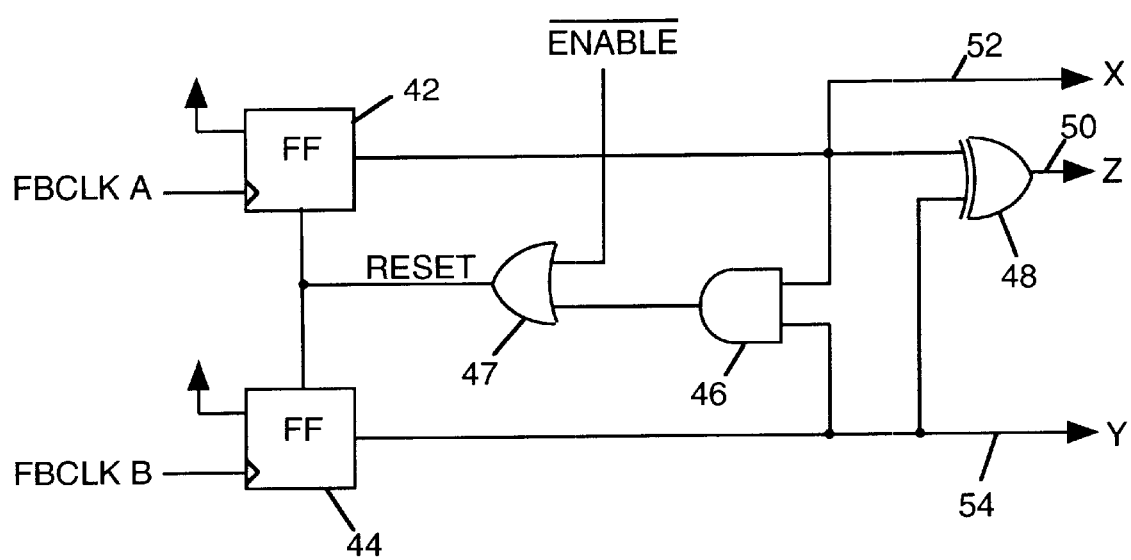
FIG. 4 is a schematic diagram of an exemplary skew measure circuit in accordance with an embodiment of the invention.

FIG. 4 is a schematic diagram of an exemplary skew measure circuit 310 in accordance with an embodiment of the invention. The skew measure circuit 310 includes a flip-flop 42 configured to receive a first clock and a flip-flop 44 configured to receive a second clock. The output of flip-flops 42, 44 are inputted to an AND gate 46 and the output of gate 46 is connected as one input to OR gate 47, the other input being the inverse of the ENABLE signal generated by gate 332 of FIG. 3. The output of gate 47 is a reset signal for flip-flops 42, 44. The output of flip-flops 42, 44 are further inputted to an exclusive-OR gate 48 in which the output of the gate 48 is the output 50 of the skew measure circuit 310. The output represents the phase error between the two clock domains.

Operationally, in skew measure circuit 310, between the inputted first clock and second clock, the clock that first clocks its respective flip-flop 42, 44, respectively) causes the exclusive-OR gate 48 to output a logic "high". The remaining clock will then clock the remaining flip-flop 42, 44 to cause the exclusive-OR gate 48 to output a logic "low". At this point, because both flip-flops 42, 44 are outputting logic "high", the AND gate 46 outputs a logic "high" which resets the two flip-flops 42, 44. The signal generated at the output 50 of the exclusive-OR gate 48 is the combined skew of the first clock and the second clock as will be further described below.

Figure 5:
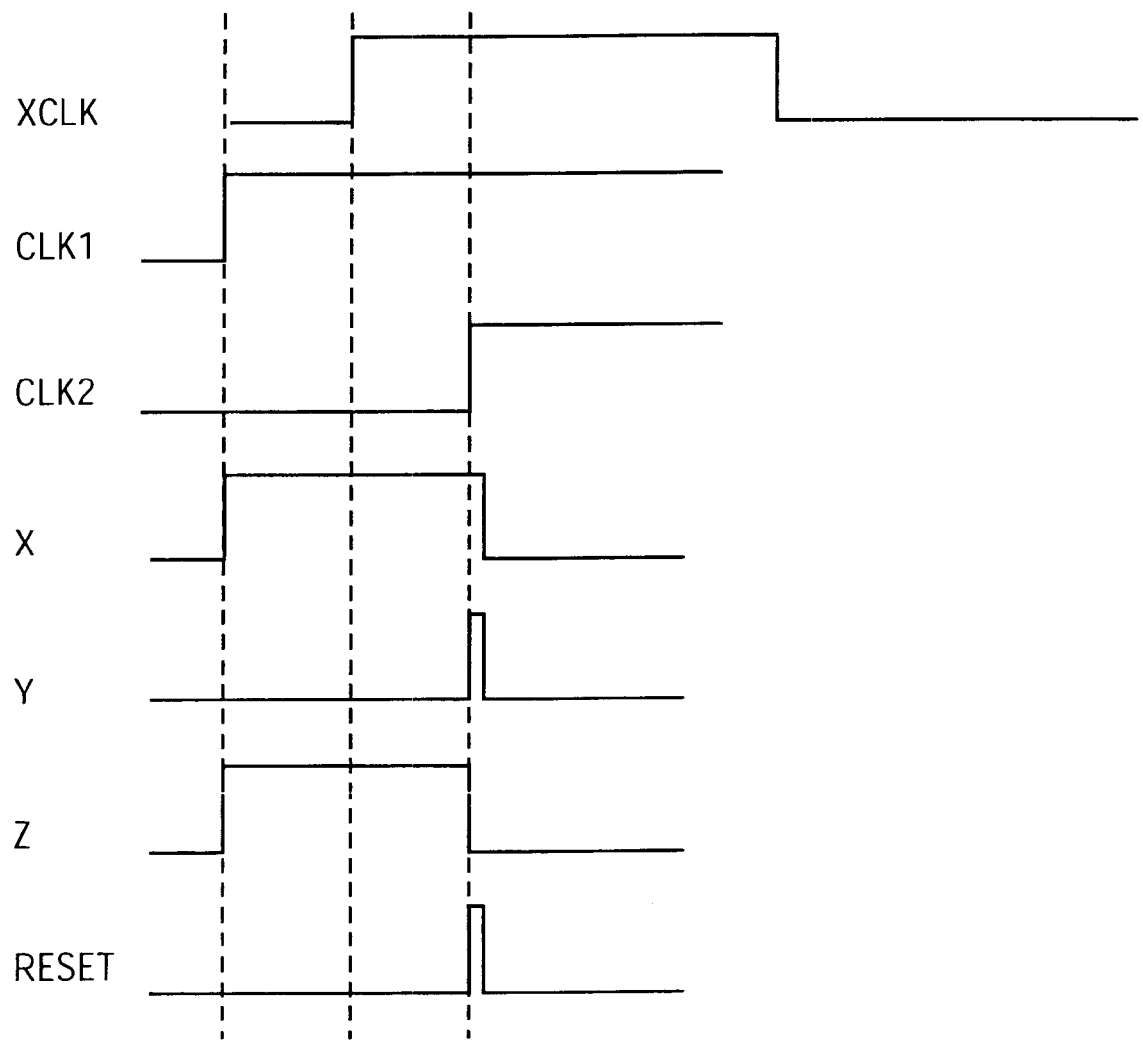
FIG. 5 is a timing diagram that aids in the understanding of the skew measure circuit shown in FIG. 4.

FIG. 5 is a timing diagram that further aids in the understanding of the skew measure circuit described above. Clock XCLK depicts the reference clock. In one example, clock CLK1 depicts the synthesized clock generated by PLL A. FIG. 5 clock CLK1 leads the reference clock XCLK. Clock CLK2 depicts the synthesized clock generated by PLL B. FIG. 5 clock CLK2 lags the reference clock XCLK. Because clock CLK 1 leads clock CLK 2, clock CLK 1 will reach its respective flip-flop before clock CLK 2.

In FIG. 5 when clock CLK 1 reaches flip-flop 42, clock CLK 1 clocks flip-flop 42 to output a logic "high". Thus, in the timing diagram, X becomes "logic high". Turning to the output Z of the exclusive-OR gate 48, because flip-flop 42 is at logic "high" and flip-flop 44 is at logic "low", the output Z is at a logic "high". When clock CLK2 reaches flip-flop 44, clock CLK2 clocks flip-flop 44 to output a logic "high". Thus, Y is logic "high". Turning to the output Z 50 of the exclusive-OR gate 48, because flip-flop 42 and flip-flop 44 are at logic "high", the output Z falls to logic "low". In the meantime, the logic "high" of both flip-flop 42 and flip-flop 44 causes output RESET of gate 47 to reset the two flip-flops, causing the two flip-flops to output a logic "low". Thus, X and Y become logic "low". Since both the outputs of the flip-flops are logic "low", the output Z remains at logic "low". From the timing diagram, it can be readily understood that the exclusive-OR gate outputs the skew ø1+ø2 if clock CLK1 is leading reference clock XCLK by ø1 and clock CLK2 is lagging reference clock XCLK by ø2.

Referring now to FIG. 3 and FIG. 4, the output 52 of flip-flop 42 is coupled to the input of programmable delay device 312. The output 54 of flip-flop 44 is coupled to the input of programmable delay device 314. The operation is now described. Between the inputted first clock and second clock, the clock that first clocks its respective flip-flop 42, 44 causes the corresponding programmable delay device 312, 314 to be enabled. The programmable delay device 312, 314 delays the activating clock by skew value ø1+ø2, if it is the phase difference between the first clock and the second clock, which is received by the programmable delay device from the exclusive OR gate 48. The phase delay caused by the enabled programmable delay device 312, 314 on the enabling clock causes the enabling clock to be in sync with the lagging clock.

Figure 6:
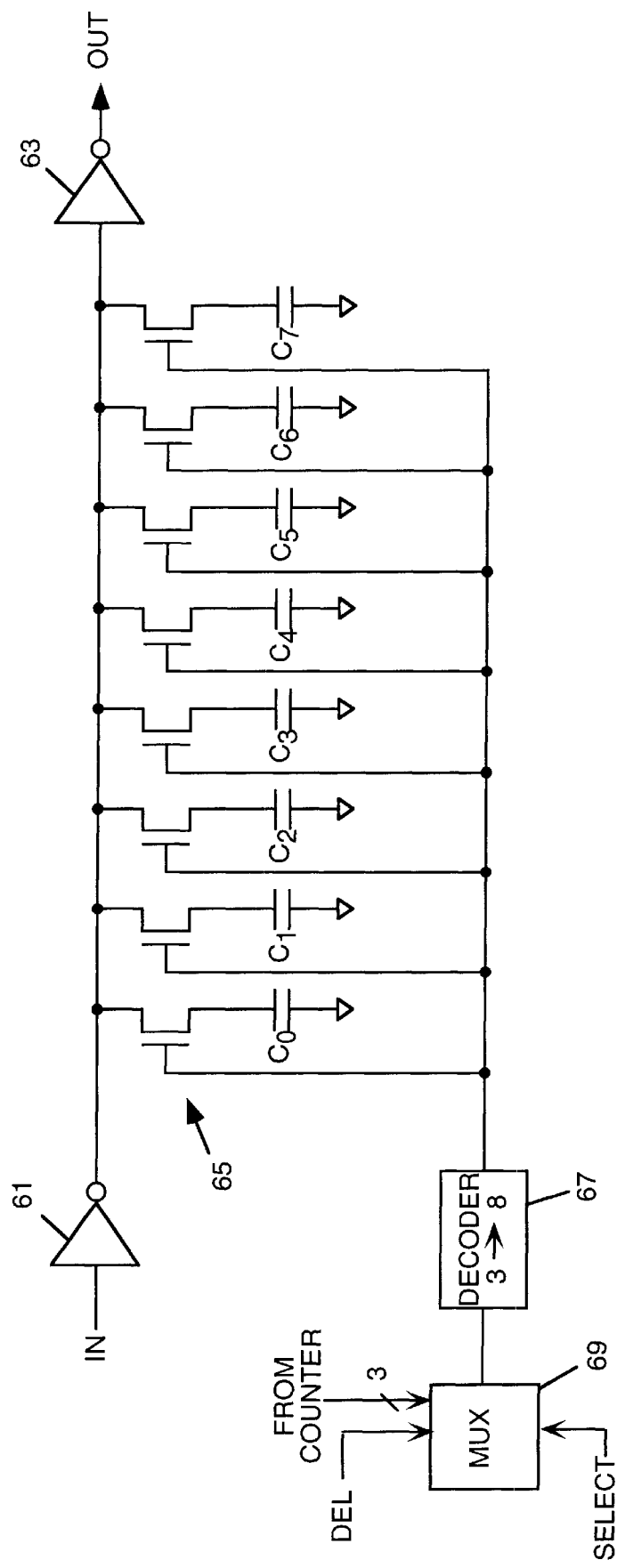
FIG. 6 is a schematic diagram of an exemplary programmable delay device in accordance with an embodiment of the invention.

FIG. 6 shows a suitable programmable delay device 312, 314 and 340. Inverter 61 operates to add a first delay to the input clock, i.e., FBCLK A or FBCLK B and invert it. Inverter 63 operates to add a second delay and invert the clock again so that it is again in phase. Transistors 65 receive as their inputs the output from 3-to-8 decoder 67. Each transistor 65 is coupled to ground through capacitor $C_0$ to $C_7$ respectively. Capacitors $C_0$ to $C_7$ may be identical or may be scaled based on a desired accuracy, i.e., resolution. The input to 3-to-8 decoder 67 is provided by counter 718 or 720 as described with reference to FIG. 7 below. Alternatively, in an implementation as described with reference to FIG. 3, the inputs to 3-to-8 decoder 67 are DEL bits which may be provided from another block on chip. The input to the decoder using MUX 69 is selected using other logic on chip.

A suitable path matching circuit 340 may be implemented the same as the programmable delay device shown in FIG. 6 except that the input to decoder 67 is a delay reference value elected by default (on power-up) such that the programmable delay devices 312, 314 and 340 have the same initial matched delays.

Figure 7:
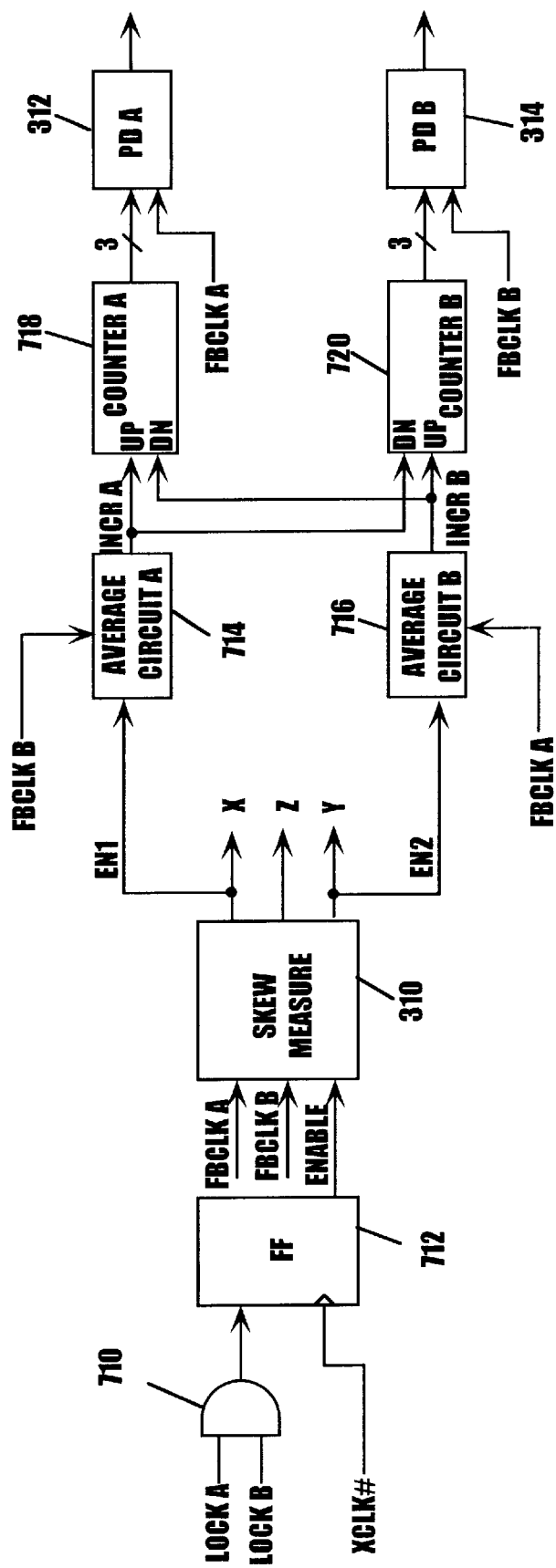
FIG. 7 is a schematic diagram of a plurality of PLL circuits in which a skew measure circuit and programmable delay devices have been implemented in accordance with another embodiment of the invention.

FIG. 7 illustrates an implementation of the invention which is adapted to dynamically compensate for skew and jitter errors between synchronous clock circuits in accordance with one embodiment of the invention. Skew measure circuit 310 and programmable delay circuits PD A 312 and PD B 314 are implemented and operate generally as described with reference to FIG. 3. The signals LOCK A and LOCK B which are asserted when PLL A and PLL B of FIG. 3 are in phase lock are input to AND gate 710. The output of AND gate 710, when there is phase lock, is input to flip-flop 712 which is then sampled with XCLK™ to generate a signal to enable skew measure circuit 310 which is used as described above with reference to FIG. 4. The outputs X and Y as described in FIG. 4, also shown as EN 1 and EN 2 in FIG. 7, are input to average circuit A 714 and average circuit B 716 along with FBCLK B and FBCLK A, respectively. A suitable implementation of average circuits 714 and 716 is described below with reference to FIG. 9. The outputs from the average circuits are used by up/down counters 718 and 720. In a preferred embodiment, counters 718 and 720 are 3 bit counters (i.e., generate a 3 bit output which ranges from 0 to 7). Operationally, the average circuit is used to ensure the stability of the compensation scheme. It only advances the counter after the skew has been stable and consistent for many cycles. It also allows the PLL to react to the new adjusted skew and stabilize before further attempting to change the delay. The counter output directly controls the delay thus adjusting the skew. Further details regarding the operation of the circuit shown in FIG. 7 are reflected in the timing diagram shown in FIG. 8.

Figure 8:
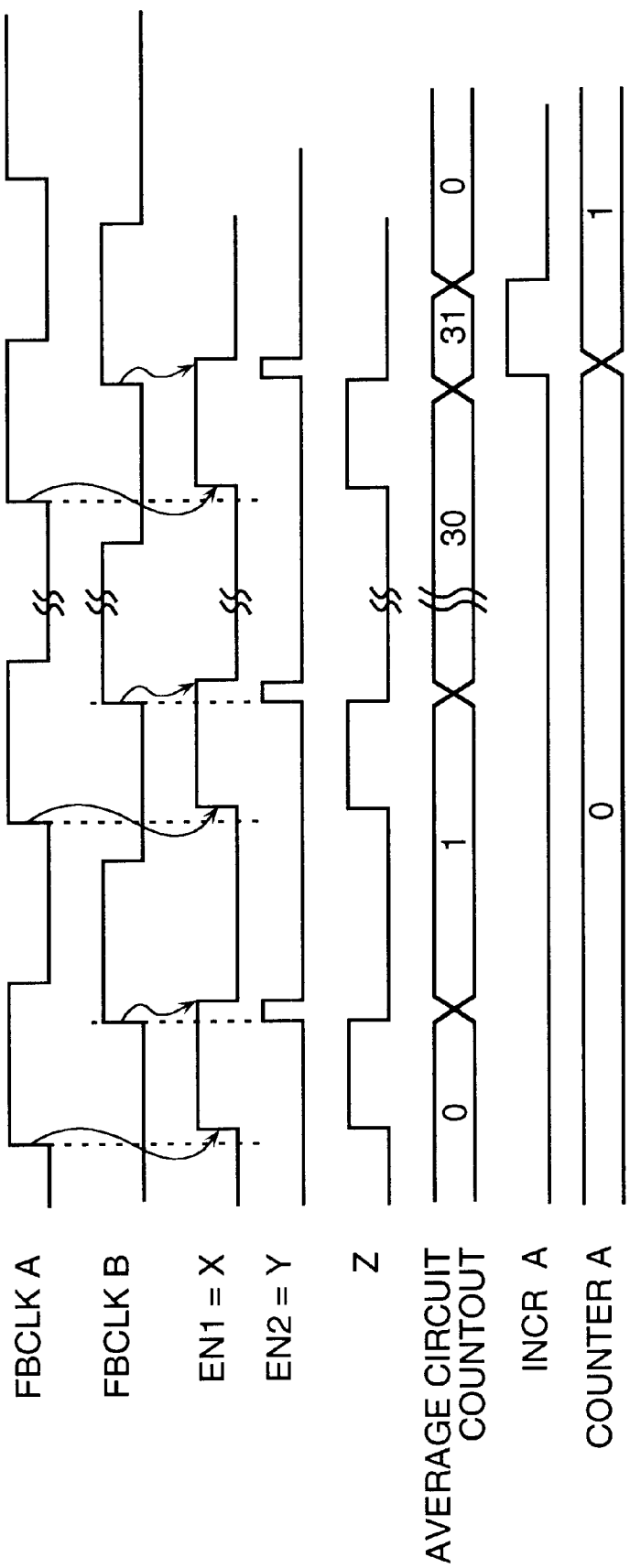
FIG. 8 is a timing diagram that aids in the understanding of the circuit shown in FIG. 7.

In FIG. 8 FBCLK A is leading FBCLK B. The compensation system will add additional delay in the FBCLK A path such that it is aligned with FBCLK B. This assumes that both PLLs are already locked and the skew measure circuit is enabled. Since FBCLK A is leading, EN1 is asserted as soon FBCLK A clocks flip-flop 42. It remain asserted until FBCLK B clocks flip-flop 44 which when asserted causes both flip-flops to deassert. EN1 will enable the average circuit A 714 and when FBCLK B arrives, it advances counter 910 shown in FIG. 9. Average circuit B 716 will not advance because EN2 which enables the counter is disabled when FBCLK A arrives. If the skew is consistent for $2^{k-1}$ cycles (e.g., 31 assuming k is 5 for a 5-bit counter) then the counter in FIG. 9 outputs 31 which matches the compared value. Then INCREMENT A is asserted which in turn clocks counter A 718 which in turn adds more delay in the FBCLK A path through PDA 312. When either INCREMENT A or B are asserted, they reset the counters in the average circuits and the process continues until both clocks are aligned such that both EN1 and EN2 are both asserted only for a very short interval which occurs after the clocks arrive. Thus, the counters will not advance when both are aligned.

Figure 9:
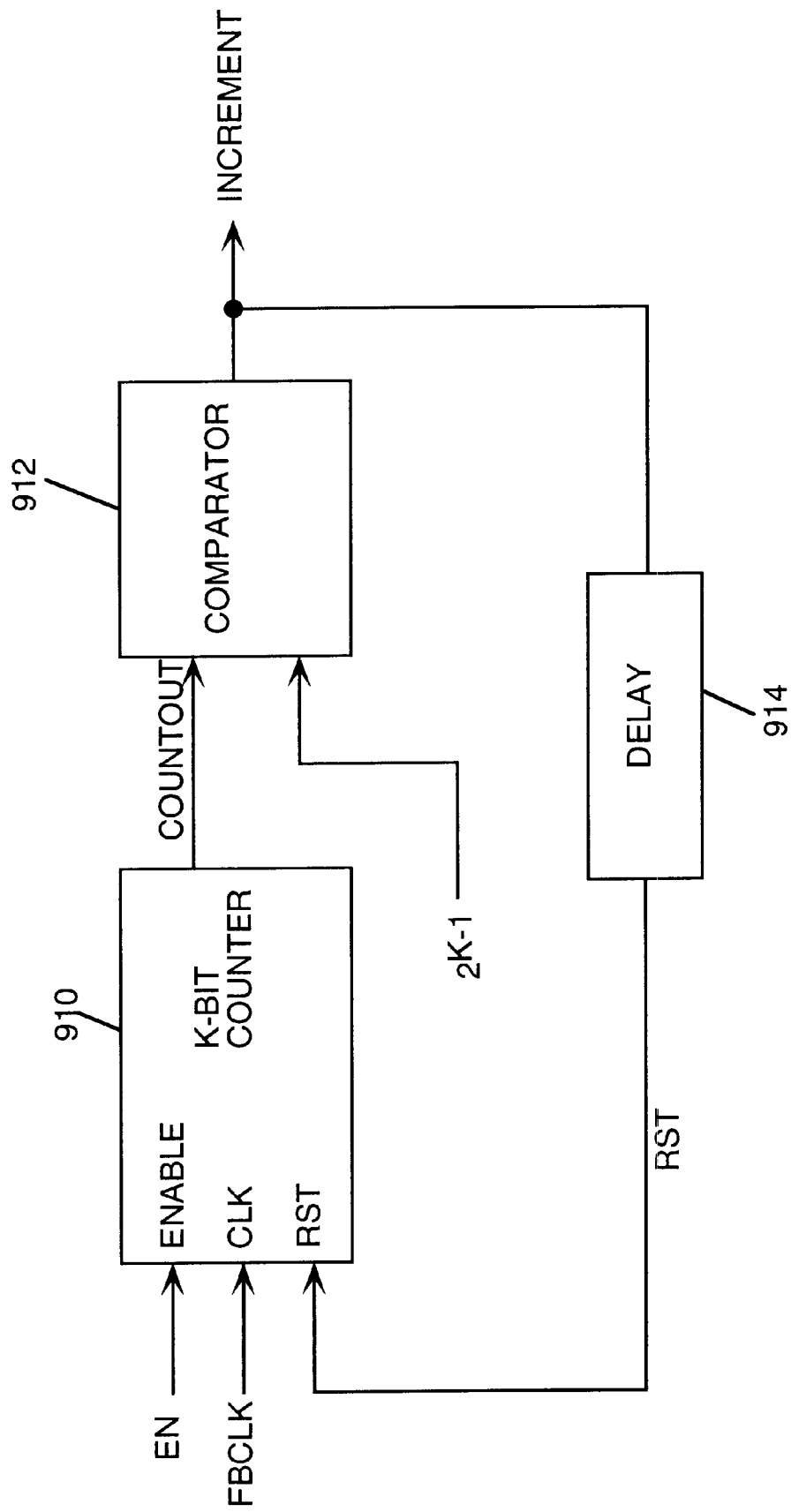
FIG. 9 is a schematic diagram of an average circuit of the type which may be used in connection with the circuit of FIG. 7.

FIG. 9 shows a suitable average circuit 714 or 716. The signal EN (EN1 or EN2) is provided to an enable input of counter 910 which in the preferred embodiment is a 5 bit counter. FBCLK (FBCLK A or FBCLK B) is the CLK input. Comparator 912 compares with output from counter 910 which is 31 for 5 bit counter. A match asserts the signal INCREMENT (INCR A or INCR B). INCREMENT after passing through delay 914 which is used to reset counter 910 in both average circuits.

Figure 10:
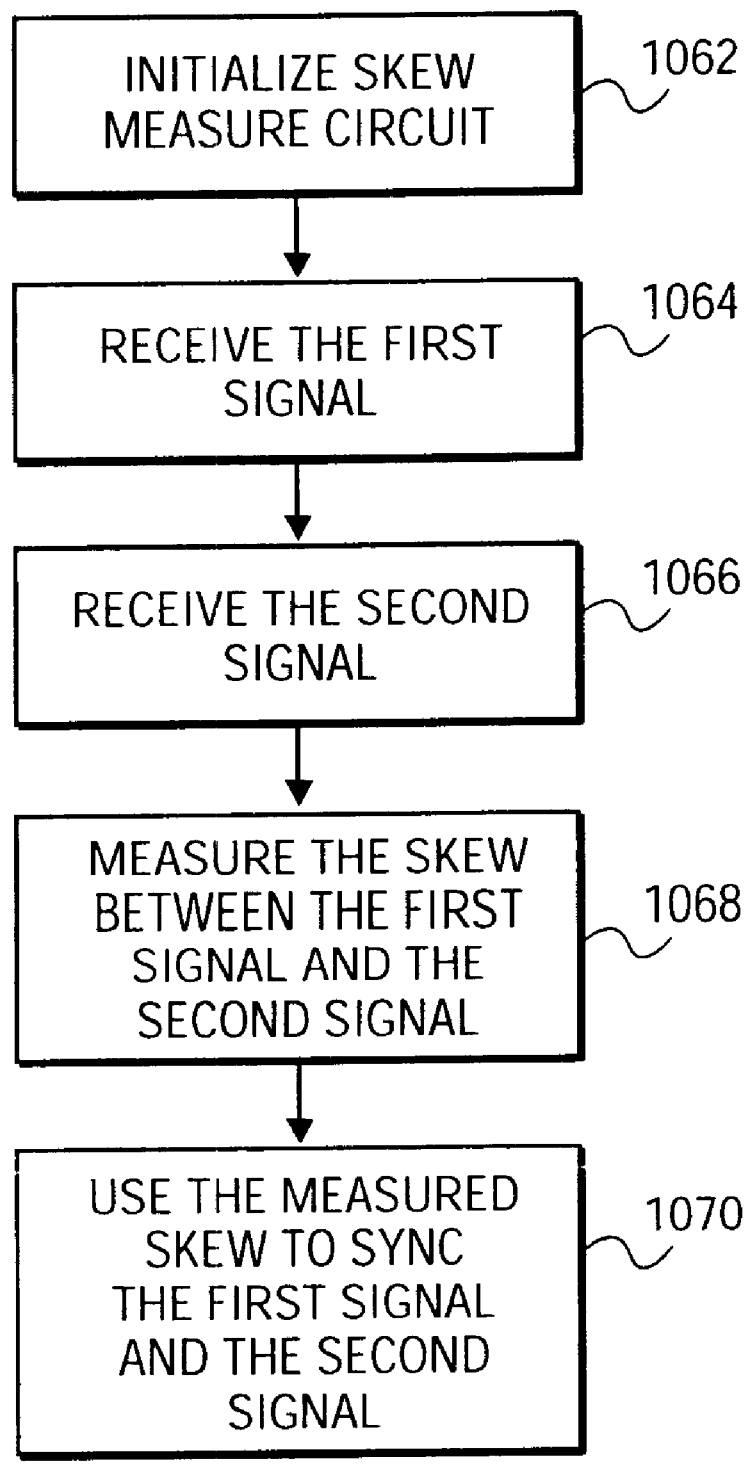
FIG. 10 is a flow chart that shows a method of dynamically compensating for skew and jitter errors between synchronous clock circuits in accordance with an embodiment of the invention.

FIG. 10 is a flow chart that shows a method of dynamically compensating for skew and jitter errors between synchronous clock circuits in accordance with one embodiment of the invention. In block 1062, the skew measure circuit is initialized and ready to receive clock signals. In one embodiment, the clock detecting circuit comprises a plurality of the flip-flops, which may be initialized by re-setting the flip-flops. After initialization, assuming that the skew between two clocks are to be measured and compensated, and a first clock signal leads a second clock signal in block 1064, the skew measure circuit receives the first clock signal, which clocks one flip-flop. In one embodiment, the asserted flip-flop causes the skew measure circuit to transmit a signal that activates a delay device in the path of the first clock signal to delay the signal. In block 1066, the skew measure circuit receives a second clock signal which clocks another flip-flop. In block 1068, the skew between the first signal and the second signal is measured. In the embodiment described above, when the two flip-flops are clocked at the same time, in block 1090, the skew measure circuit outputs very short interval pulses at the same time such that the delay value is maintained, thus, the first clock signal and the second clock signal are in sync.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
    a plurality of programmable delay lines corresponding to a plurality of signals, each delay line being in a path of a corresponding signal; and
    a skew measure circuit configured to receive at least two signals to be synchronized and determine a phase difference between the at least two signals, the skew measure circuit coupled to the plurality of delay lines, and the skew measure circuit outputs phase difference signal to at least one of the delay lines to delay at least one of the signals to be synchronized such that the signals are in synchronization, wherein said phase difference signal output by said skew measure circuit represents a combined skew of said two signals when one signal leads a reference signal and another signal lags the reference signal.

2. The apparatus as in claim 1, wherein the skew measure circuit comprises:
    a first latch that is enabled at a start of a first signal; and
    a second latch that is enabled at a start of a second signal, wherein if the first latch is first enabled, the skew measure circuit enables the programmable delay line corresponding to the first signal, and if the second latch is first enabled, the skew measure circuit enables the programmable delay line corresponding to the second signal.

3. The apparatus as in claim 2, wherein the skew measure circuit further comprises:
    a logic circuit configured such that its output represents the combined skew of the first signal and the second signal.

4. The apparatus as in claim 3, wherein the duration of the enablement of the logic circuit is a duration of a delay programmed into the enabled programmable delay line by the skew measure circuit.

5. The apparatus as in claim 3, wherein the skew measure circuit further comprises a reset circuit to reset the first latch and the second latch when both latches are enabled.

6. A method comprising:
    receiving a first signal;
    receiving a second signal;
    determining between the received first signal and second signal, which signal is leading;
    determining a phase difference between the first signal and the second signal, wherein said phase difference represents a combined skew of said first and second signals when one signal leads a reference signal and another signal lags the reference signal; and
    delaying the leading signal by the phase difference such that the first signal and the second signal are in synchronization.

7. The method as in claim 6, wherein the step of determining which signal is leading, further comprises:
    latching the first signal;
    latching the second signal;
    determining which of the first signal and the second signal has been first latched; and
    selecting a programmable delay line corresponding to the first latched signal.

8. The method as in claim 7, wherein the step of determining a phase difference further comprises:
    determining a duration between the latching of one of the first signal and second signal and the latching of the remaining signal.

9. The method as in claim 8, further comprising:
    programming the selected delay line to delay a receiving signal in the duration between the latching of one of the first signal and second signal and the latching of the remaining signal.

10. The method as in claim 8, further comprising:
    resetting latches after the first signal and the second signal have latched.

11. A system comprising:
    a first phase locked loop (PLL) circuit configured to have a first signal in a feedback loop;
    a second PLL circuit configured to have a second signal in a second feedback loop;
    a first programmable delay line being coupled to the first PLL circuit and in a path of the first signal;
    a second programmable delay line being coupled to the second PLL circuit and in a path of the second signal;
    a skew measure circuit configured to receive the first and second signal to determine a phase difference between the two signals, the skew measure circuit coupled to the first and second delay lines, and the skew measure circuit further configured to use the phase difference to program at least one of the first and second delay lines to delay at least one of the first and second signals such that the first and second signals are in synchronization.

12. The system as in claim 11, wherein the skew measure circuit comprises;
    a first latch that is enabled at a start of a first signal; and
    a second latch that is enabled at a start of a second signal, wherein if the first latch is first enabled, the skew measure circuit enables the first programmable delay line corresponding to the first signal, and if the second latch is first enabled, the skew measure circuit enables the second programmable delay line corresponding to the second signal.

13. The system as in claim 12, wherein the skew measure circuit further comprises:
    a logic circuit configured such that its output represents the combined skew of the first signal and the second signal.

14. The system as in claim 13, wherein the duration of the enablement of the logic circuit is the duration of the delay programmed into the enabled programmable delay line by the skew measure circuit.

15. The system as in claim 13, wherein the skew measure circuit further comprises a reset circuit to reset the first latch and the second latch when both latches are enabled.

16. A system comprising:
    a skew measure circuit configured to receive at least first and second clock signals from corresponding at least first and second phase locked loop circuits and to determine a phase difference between the at least two signals;
    at least first and second average circuits coupled to corresponding outputs of said skew measure circuit;
    at least first and second counters coupled to outputs of said at least first and second average circuits;
    at least first and second programmable delay lines coupled to outputs of said at least first and second counters;
    wherein the at least first and second average circuits operate to advance the at least first and second counters after skew determined by said skew measure circuit has been stable and consistent for a predetermined number of cycles and enable the at least first and second phase locked loop circuits to react to the adjusted skew and stabilize before further attempting to change the delay.

17. The system defined by claim 16 wherein said at least first and second average circuits each comprise:
    a counter;
    a comparator coupled to said counter and adapted to assert an output signal when said counter has reached its maximum value;
    a delay element coupled between an input to said counter and an output of said comparator.

* * * * *